(12) United States Patent
Lin et al.

(10) Patent No.: US 7,922,362 B2
(45) Date of Patent: Apr. 12, 2011

(54) CIRCUIT BOARD ASSEMBLY AND BACKLIGHT MODULE COMPRISING THE SAME

(75) Inventors: Yu-Kai Lin, Hsinchu (TW); Ya-hsien Chang, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 288 days.

(21) Appl. No.: 12/062,850

(22) Filed: Apr. 4, 2008

(65) Prior Publication Data
US 2009/0103302 A1    Apr. 23, 2009

(30) Foreign Application Priority Data
Oct. 19, 2007  (TW) ................................ 96139247 A

(51) Int. Cl.
*F21V 29/00* (2006.01)
(52) U.S. Cl. ........ 362/294; 362/373; 361/719; 361/720; 257/706
(58) Field of Classification Search ................. 362/97.3, 362/218, 294, 373, 547, 631; 361/719, 720; 257/706
See application file for complete search history.

(56) References Cited

U.S. PATENT DOCUMENTS

| 4,299,873 | A | 11/1981 | Ohihara et al. | |
|---|---|---|---|---|
| 5,920,458 | A | 7/1999 | Azar | |
| 2005/0024834 | A1 | 2/2005 | Newby | |
| 2007/0201247 | A1* | 8/2007 | Ohno et al. | 362/631 |

FOREIGN PATENT DOCUMENTS

| CN | 1830085 | 9/2006 |
|---|---|---|
| CN | 1837926 | 9/2006 |
| CN | 1941346 | 4/2007 |
| TW | I246370 | 1/1993 |
| TW | 00453629 | 9/2001 |
| TW | 200524515 | 7/2005 |
| TW | I255691 | 5/2006 |
| TW | 96106301 | 2/2007 |

OTHER PUBLICATIONS

English language translation of abstract of TW I246370.
English language translation of abstract of TW 96106301.
English language translation of abstract of TW 00453629.
Chinese language office action dated Sep. 25, 2009.
English language translation of abstract and pertinent parts of CN 1837926 (published Sep. 27, 2006).
English language translation of abstract and pertinent parts of CN 1830085 (published Sep. 9, 2006).
English language translation of abstract and pertinent parts of CN 1941346 (published Apr. 4, 2007).
Taiwanese language office action dated Jun. 18, 2010.
English language translation of abstract and pertinent parts of TW 200524515 (published Jul. 16, 2005).
English language translation of abstract and pertinent parts of TW I255691 (published May 21, 2006).

* cited by examiner

*Primary Examiner* — Stephen F Husar
(74) *Attorney, Agent, or Firm* — Thomas, Kayden, Horstemeyer & Risley, LLP

(57) ABSTRACT

A circuit board assembly and a backlight module comprising the circuit board assembly are provided. The circuit board assembly has a first surface and a second surface opposite to the first surface, and further comprises at least one laminate, a first conductive wiring structure and a coating. The first conductive wiring structure is formed on the first surface. The coating is formed on the coating area of the second surface, wherein the coating can conduct heat and provide electric insulation. Thus, the circuit board assembly is adapted to outwardly conduct heat from the laminate through the second surface and to promote the heat dissipation efficiency of the circuit board assembly.

20 Claims, 3 Drawing Sheets

CIRCUIT BOARD ASSEMBLY AND BACKLIGHT MODULE COMPRISING THE SAME

This application claims the benefit from the priority of Taiwan Patent Application No. 096139247 filed on Oct. 19, 2007, the disclosures of which are incorporated by reference herein in their entirety.

CROSS-REFERENCES TO RELATED APPLICATIONS

Not applicable.

BACKGROUND OF THE INVENTION

1. Field of the Invention

The present invention relates to a circuit board assembly and a backlight module, specifically, a circuit board assembly and a backlight module for use in a liquid crystal display (LCD).

2. Descriptions of the Related Art

Liquid crystal displays (LCD) have many advantages, such as low power consumption, low emission, small footprints, light weight, and is the most commonly used display. Therefore, LCDs have found widespread use in electronic products incorporating display screens, such as mobile phones, digital cameras, personal digital assistants (PDAs) and TV sets. However, since the liquid crystal layer of LCDs does not emit light per se, an additional light source is required. Light emitted therefrom has to be manipulated by the pixel liquid crystals and filtered by a color filter before forming an image on the screen. Generally, the additional light source is known as the backlight module.

FIG. 1 depicts the side view of a backlight module 1 using a light emitting diode (LED) as the light source. The backlight module 1 consists of at least one LED 10, a printed circuit board (PCB) 11, a thermo-conductive material 12 and a bezel 13. The LED 10 is disposed on the PCB 11 to receive the current and various control signals from the PCB 11. The thermo-conductive material 12 is disposed beneath the PCB 11 to conduct heat from the PCB 11 to the bezel 13 (typically a metallic bezel). This heat dissipation mechanism for the LED 10 will provide a better color uniformity.

As depicted in FIG. 2, the conventional PCB 11 further comprises a laminate 111 and conductive structures 113 formed on the upper and lower surfaces of the laminate 111 respectively. Usually, a solder-resist layer 115, typically in a green or brown color is further applied on the conductive structures 113 of the PCB 11. The solder-resist layer 115 helps to restrict the soldering tin applied only on the specific regions during the downstream process of soldering the PCB 11. The PCB surface is then protected against pollution, oxidization and short-circuiting during the subsequent soldering and cleaning processes.

However, the conventional solder-resist is made of a material that may retard electro-conduction and thermo-conduction. Although a thermo-conductive material 12 is often applied onto the bottom surface of the PCB 11 in the backlight module 1 of the prior art, the retarding impact exerted by the solder-resist 115 on the thermo-conduction may heavily discount the heat dissipation performance. Eventually, the poor heat dissipation performance of the PCB 11 may lead to uniformity degradation of light provided by the backlight module 1, thus deteriorating the overall quality of the LCD.

Accordingly, it is important to dissipate heat effectively by eliminating the impact of the solder-resist on the PCB of a backlight module that uses an LED as the light source.

SUMMARY OF THE INVENTION

One objective of this invention is to provide a circuit board assembly with improved heat dissipation efficiency. The circuit board assembly has a thermo-conductive and electro-insulating coating formed thereon to replace the conventional solder-resist coating. The heat dissipation of the circuit board assembly is thereby improved, allowing for the electro-insulating characteristics. To this end, a circuit board assembly disclosed in this invention has a first surface and a second surface opposite to the first surface. The circuit board assembly further comprises at least one laminate, a first conductive wiring structure and a coating. The first conductive wiring structure is formed on the first surface, while the coating is formed on the coating area of the second surface. Both thermo-conductive and electro-insulating, the coating is adapted to outwardly dissipate heat from the laminate through the second surface.

Another objective of this invention is to provide a backlight module with improved heat dissipation efficiency for use in a liquid crystal display (LCD). The backlight module comprises a bezel, a light source, and a circuit board assembly described above. The circuit board assembly has a thermo-conductive and electro-insulating coating formed thereon to replace the conventional solder-resist coating, such that the heat efficiency thereof may be increased by conducting heat to the bezel via the second surface. The heat dissipation, as well as the overall performance of the light source of the backlight module, is improved.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
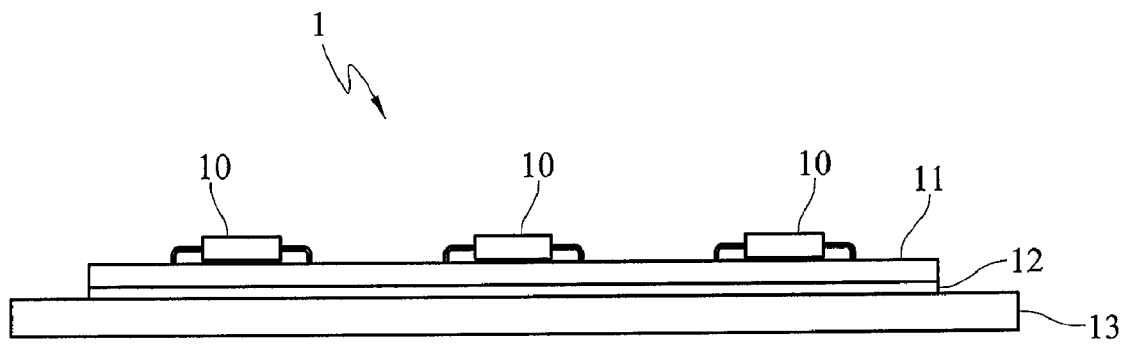
FIG. 1 is a schematic view illustrating the conventional backlight module.
Figure 2:
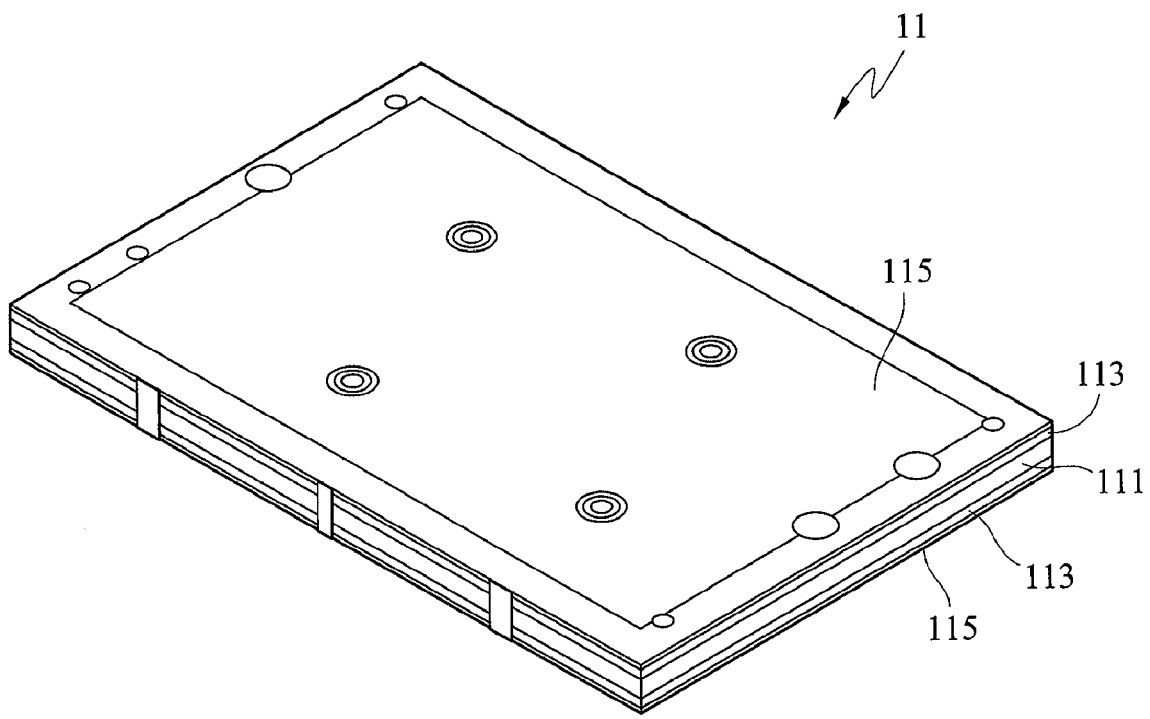
FIG. 2 is a schematic view illustrating the conventional circuit board.
Figure 3:
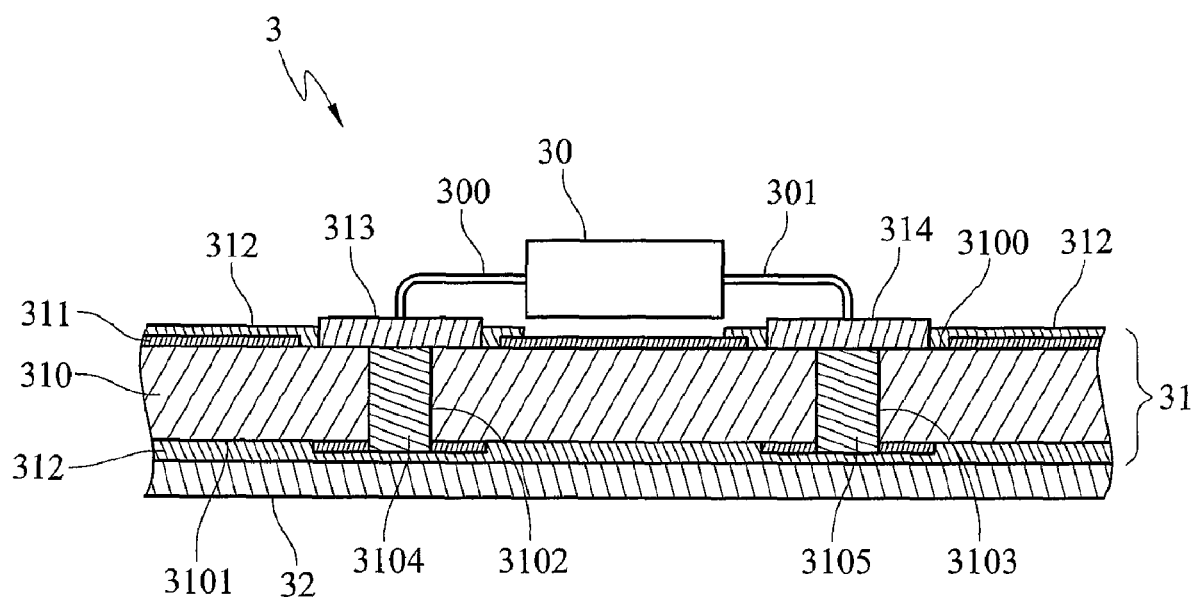
FIG. 3 is a schematic view illustrating an embodiment of this invention.

The preferred embodiments of the backlight module according to this invention will be described in the following paragraphs. As shown in FIG. 3, without significantly modifying the structure of the conventional backlight module, the backlight module 3 of this invention comprises a light source 30, a circuit board assembly 31 and a bezel 32. The circuit board assembly 31 is disposed on the bezel 32, and may be defined with having the first surface 3100 and second surface 3101 opposite to the first surface 3100, in which the second surface 3101 faces the bezel 32 and the first surface 3100 is used for arranging the light source 30 thereon. In this embodiment, the light source 30 is an LED, the circuit board assembly 31 is a PCB, and the bezel 32 is a metallic bezel (e.g., a copper bezel). In more detail, the circuit board assembly 31 further comprises at least one laminate 310, a first conducive wiring structure 311 and a coating 312.

The first conductive wiring structure 311 is formed on the first surface 3100. More specifically, the first conductive wiring structure 311 is a group of copper conductors formed on the PCB to electrically interconnect various components disposed on the PCB. The coating 312 is formed at least on a coating area of the second surface 3101. The coating 312 used in this invention is characterized by its thermo-conductive and electro-insulating properties that can conduct heat from the second surface 3101 of the laminate 310 to the bezel 32. The coating 312 is made of a material selected from the following group: boron nitride, silicon carbide, aluminum nitride, beryllium nitride, or a combination thereof. However, this invention is not just limited thereto, and the coating 312 may also be made of other materials with both thermo-conductive and electro-conductive properties.

Additionally, the circuit board assembly 31 is further formed with through-holes 3102, 3103, which have thermo-conductive structures formed therein respectively. In more detail, a thermo-conductive structure 3104 is formed in the through-hole 3102, which may fully occupy the through-hole 3102 or just be formed on the sidewalls thereof. Also, a thermo-conductive structure 3105 is formed in the through-hole 3103 in a similar way. As a result, heat may be conducted from the first surface 3100 to the second surface 3101, and further conducted to the bezel 32 via the coating 312.

The circuit board assembly 31 further comprises pads 313, 314 disposed on the first surface 3100 to substantially cover the first through-holes 3102, 3103 at the periphery thereof. Since the thermo-conductive structures 3104, 3105, made of a thermo-conductive material (e.g., copper), are formed in the through-holes 3102, 3103 and connected to the pads 313, 314 respectively, the heat generated by the light source 30 may be effectively conducted from conductors 300, 301, which is respectively connected with the pads 313, 314, to the bezel 32 via the thermo-conductive structures 3104, 3105 and the coating 312. The overall heat dissipation efficiency of the backlight module 3 is thereby increased.

In addition, the second surface 3101 of the laminate 310 may also have a conductive wiring structure (not shown) formed thereon. In this case, the conductive wiring structure is formed between the coating area of the second surface 3101 and the coating 312 so that the conductive wiring structure may be covered by the coating 312 for electro-insulation. Additionally, even though the conventional solder-resist coating may be applied onto the first conductive wiring structure 311 formed on the first surface 3100 of the circuit board assembly 31, the coating 312 is preferably applied on the first conductive wiring structure 311 instead, to further increase the heat dissipation efficiency.

Figure 4:
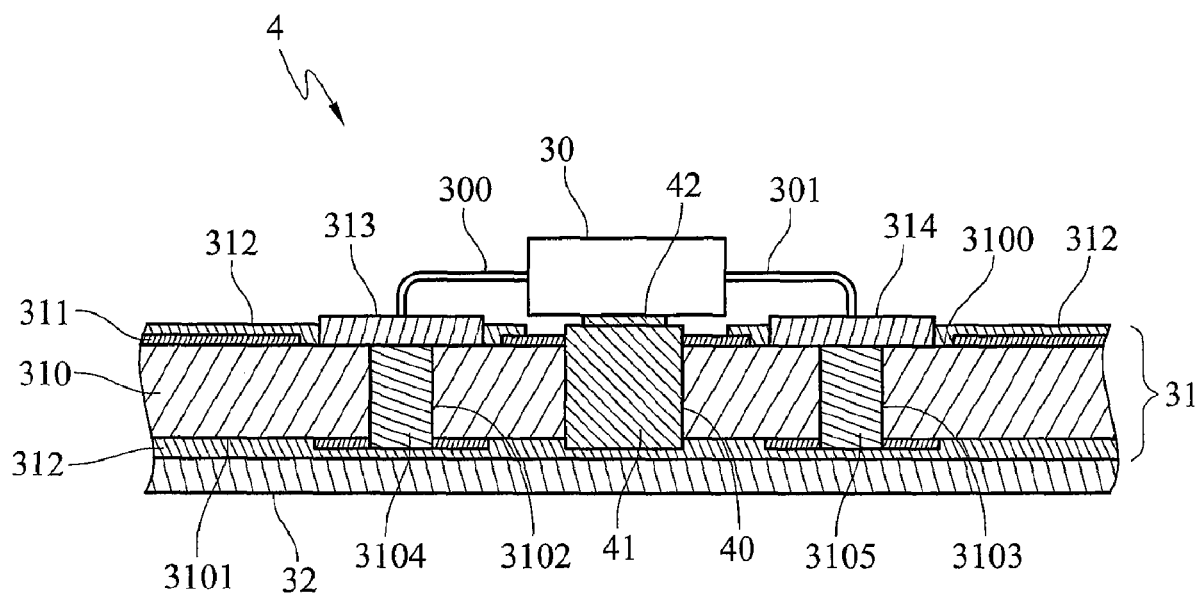
FIG. 4 is a schematic view illustrating another embodiment of this invention.

FIG. 4 depicts another preferred embodiment of the backlight module of this invention. The backlight module 4 of this embodiment is substantially the same as the backlight module 3 of the previous embodiment, and therefore only distinct features will be described herein. In this embodiment, to facilitate the heat dissipation from the light source 30, the laminate 310 may further have a through-hole 40 formed therein, with a thermo-conductive structure 41 disposed in the through-hole 41. The light source 30 may make contact with the thermo-conductive structure 41 via the heat slug 42 so that heat generated by the light source 30 is conducted directly to the bezel 32 through the heat slug 42, the thermo-conductive structure 41 and the coating 312. The overall heat dissipation efficiency of the backlight module is thus increased.

Figure 5:
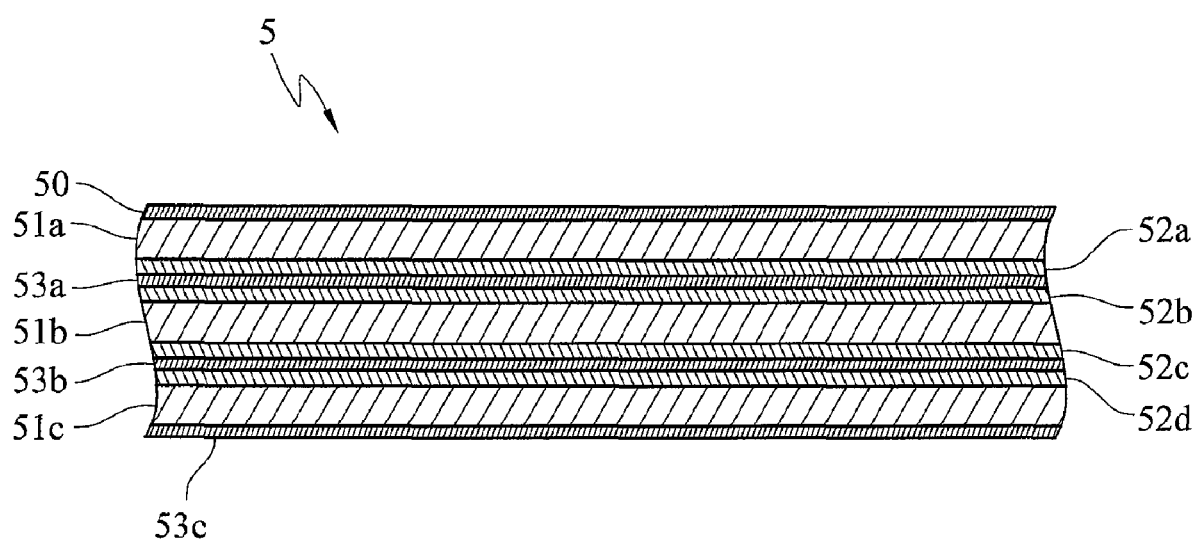
FIG. 5 is a schematic view illustrating a circuit board assembly in accordance with still another embodiment of this invention.

FIG. 5 depicts yet another preferred embodiment of the backlight module of this invention. The circuit board assembly 5 in this embodiment is a multilayered board structure comprising, for example, a plurality of sequentially stacked laminates 51a, 51b, 51c. These laminates 51a, 51b, 51c have at least one electrode layer interposed therebetween, which is depicted as a plurality of electrode layers 52a, 52b, 52c, 52d in FIG. 5. In addition to the coating 53c applied onto the bottom surface (i.e., the second surface described in the previous embodiments) of the circuit board assembly 5, coatings 53a, 53b are further applied between the electrode layers 52a, 52b, 52c, 52d to provide both electro-insulation and thermo-conduction therebetween. Moreover, even though the conventional solder-resist coating may be applied onto the top surface (i.e., the first surface described in the previous embodiments) of the circuit board assembly 5, the coating 50 is preferably applied instead in this embodiment, thereby to further increase the overall heat dissipation efficiency of the backlight module.

The above descriptions describe the backlight module and circuit board assembly of this invention. The heat generated by the light source of the circuit board assembly is conducted through a both thermo-conductive and electro-insulating coating to the bezel, and is then dissipated outwards. In this way, the overall heat dissipation efficiency of the backlight module is increased, thus improving the heat dissipation. Moreover, the coating of this invention also helps to restrict solder tin being applied only on specific regions during the downstream soldering process and protects the board surface against contamination, oxidization and short-circuit caused during subsequent soldering and cleaning processes.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:
1. A circuit board assembly, comprising:
at least one laminate defining a first surface and a second surface opposite to the first surface, wherein the at least one laminate is formed with a through hole;
a first conductive wiring structure formed on the first surface;
a thermo-conductive structure formed in the through hole to conduct heat from the first surface to the second surface;
a pad disposed on the first surface to substantially cover the through hole at a periphery thereof; and
a coating at least formed on the second surface at a coating area thereof, wherein the coating is thermo-conductive and electro-insulating, and is adapted to outwardly dissipate heat from the at least one laminate through the second surface.
2. The circuit board assembly as claimed in claim 1, wherein the coating is made of a material selected from the group comprising: boron nitride, silicon carbide, aluminum nitride, beryllium nitride and the combination thereof.
3. The circuit board assembly as claimed in claim 1, wherein the thermo-conductive structure is made of a thermo-conductive material, formed in the through hole and con- nected with the pad, and the thermo-conductive material is a metallic material comprising copper.

4. The circuit board assembly as claimed in claim 1, wherein the coating is further applied onto the first conductive wiring structure.

5. The circuit board assembly as claimed in claim 1, further including an insulation coating, at least being applied onto the first conductive wiring structure.

6. The circuit board assembly as claimed in claim 1, wherein the circuit board assembly is a printed circuit board.

7. The circuit board assembly as claimed in claim 1, wherein the at least one laminate includes a plurality of laminates which are sequentially stacked, and the circuit board assembly further comprises at least one electrode layer disposed between the plurality of laminates.

8. The circuit board assembly as claimed in claim 7, wherein the at least one electric layer comprises a plurality of electrode layers disposed between the plurality of laminates, in which the coating is applied between the electrode layers.

9. A backlight module, including:
a bezel;
a light source; and
a circuit board assembly disposed on the bezel, the circuit board assembly including:
at least one laminate defining a first surface and a second surface opposite to the first surface, wherein the second surface faces the bezel and the first surface is provided for the light source;
a first conductive wiring structure formed on the first surface; and
a coating at least formed on the second surface at a coating area thereof, wherein the coating is thermo-conductive and electro-insulating and is adapted to conduct heat from the at least one laminate through the second surface to the bezel.

10. The backlight module as claimed in claim 9, wherein the coating is made of a material selected from the group comprising: boron nitride, silicon carbide, aluminum nitride, beryllium nitride and the combination thereof.

11. The backlight module as claimed in claim 10, wherein the circuit board assembly is formed with at least one through hole and has at least one thermo-conductive structure formed in the at least one through hole to conduct heat from the first surface to the second surface.

12. The backlight module as claimed in claim 11, wherein the at least one through hole includes a first through hole, the at least one thermo-conductive structure includes a first thermo-conductive structure, and the circuit board assembly further includes a pad disposed on the first surface to substantially cover the through hole at a periphery thereof.

13. The backlight module as claimed in claim 12, wherein the thermo-conductive structure is made of a thermo-conductive material, formed in the through hole and connected with the pad, and the thermo-conductive material is a metallic material comprising copper.

14. The backlight module as claimed in claim 12, wherein the light source includes a conductive wiring connected with the pad, in which heat is conducted from the light source to the bezel through the first thermo-conductive structure and the coating.

15. The backlight module as claimed in claim 12, wherein the at least one through hole further includes a second through hole and the at least one thermo-conductive structure further includes a second thermo-conductive structure formed in the second through hole, the light source connected with the second thermo-conductive structure through a heat slug, whereby, heat is conducted to the bezel through the heat slug, the second thermo-conductive conductive structure and the coating.

16. The backlight module as claimed in claim 9, wherein the coating further is applied onto the first conductive wiring structure.

17. The backlight module as claimed in claim 9, wherein the circuit board assembly further includes an insulation coating at least being applied onto the first conductive wiring structure.

18. The backlight module as claimed in claim 9, wherein the circuit board assembly is a printed circuit board.

19. The backlight module as claimed in claim 9, wherein the at least one laminate includes a plurality of laminates which are sequentially stacked, and the circuit board assembly further comprises at least one electrode layer disposed between the plurality of laminates.

20. The backlight module as claimed in claim 19, wherein the at least one electrode layer comprises a plurality of electrode layers disposed between the plurality of laminates, in which the coating is applied between the electrode layers.

* * * * *